United States Patent [19]

Salvage et al.

[11] Patent Number: 4,806,888
[45] Date of Patent: * Feb. 21, 1989

[54] MONOLITHIC VECTOR MODULATOR/COMPLEX WEIGHT USING ALL-PASS NETWORK

[75] Inventors: Seward T. Salvage, Palm Bay; Edward E. Messer, Jr., Palm Bay N.W., both of Fla.

[73] Assignee: Harris Corp., Melbourne, Fla.

[ * ] Notice: The portion of the term of this patent subsequent to Oct. 13, 2004 has been disclaimed.

[21] Appl. No.: 851,726

[22] Filed: Apr. 14, 1986

[51] Int. Cl.[4] .............................................. H03H 7/18
[52] U.S. Cl. .................................. 333/138; 333/81 R; 307/511
[58] Field of Search ............... 333/138, 137, 156, 164, 333/81 R, 81 A; 307/511, 512, 513; 328/155, 55

[56] References Cited

U.S. PATENT DOCUMENTS

| 3,784,934 | 1/1974 | Ohsawa | 333/138 |
| 4,558,291 | 12/1985 | Nichols | 333/81 R X |
| 4,581,595 | 4/1986 | Silagi | 333/138 X |
| 4,608,543 | 8/1986 | Adams | 331/8 |
| 4,663,594 | 5/1987 | Perkins | 307/511 X |
| 4,700,153 | 10/1987 | Salvage et al. | 333/81 R |

FOREIGN PATENT DOCUMENTS

| 2231156 | 12/1974 | France | 328/155 |
| 0083101 | 7/1981 | Japan | 333/117 |
| 0056523 | 4/1983 | Japan | 328/155 |
| 0041812 | 3/1985 | Japan | 333/164 |
| 0083413 | 5/1985 | Japan | 328/155 |

OTHER PUBLICATIONS

Suckling et al., "S. Band Phase Shifter Using Monolithic GaAs Circuits", ISSCC Digest of Technical Papers, Feb. 1982, p. 134.

Primary Examiner—Eugene R. Laroche
Assistant Examiner—Seung Ham
Attorney, Agent, or Firm—Antonelli, Terry & Wands

[57] ABSTRACT

A complex weighting device contains parallel all-pass networks selectively feeding a pair of differential amplifiers, so as to produce a set of mutually orthogonal vector outputs. These outputs are coupled to an attenuator network comprised of dual gate field effect transistors for controllably attenuating the vector outputs of the differential amplifiers. The attenuated vectors are selectively combined to realize a prescribed degree of phase shift from 0° to 360° through the complex weight.

16 Claims, 2 Drawing Sheets

MONOLITHIC VECTOR MODULATOR/COMPLEX WEIGHT USING ALL-PASS NETWORK

FIELD OF THE INVENTION

The present invention relates to communication and radar systems and is particularly directed to a complex weighting device employing all-pass network components.

BACKGROUND OF THE INVENTION

Signal processing networks, such as adaptive arrays, make wide use of complex weighting devices. Indeed adaptive array antennas may employ several thousand complex weights for steering one or more antenna beams. In microwave communication and radar systems, component fabrication preferably takes the form of monolithic microwave integrated circuits (MMICs) which offer low cost, miniaturization and high reliability, considerations that are particularly acute in dynamic applications, such as airborne environments. To date, however, such hardware designs have not yet realized a practical implementation for a complex weight that enjoys the same advantages as other microwave circuit components. Instead, such components have typically employed couplers (3 dB hybrids), high pass/low pass networks containing inductive elements in the phase split network, which add unwanted physical size and are bandlimited.

SUMMARY OF THE INVENTION

In accordance with the present invention, the above-mentioned drawbacks of conventional complex weight configurations are obviated by a circuit approach that employs parallel all-pass networks selectively feeding a pair of differential amplifiers, so as to produce a set of mutually orthogonal vector outputs. These outputs are coupled to an attenuator network preferably comprised of dual gate field effect transistors for controllably attenuating the vector outputs of the differential amplifiers. The attenuated vectors are selectively combined (vector-summed) to realize a prescribed degree of phase shift (from 0° to 360°) and attenuation through the complex weight. Because of the nature of all-pass construction, the weight is inherently broadband. Also, all of the components of the complex weight can be fabricated as compact monolithic elements, so that the inventive circuit is useful in a wide variety of microwave signal processing applications, particularly those requiring MMICs.

DETAILED DESCRIPTION

Figure 1:
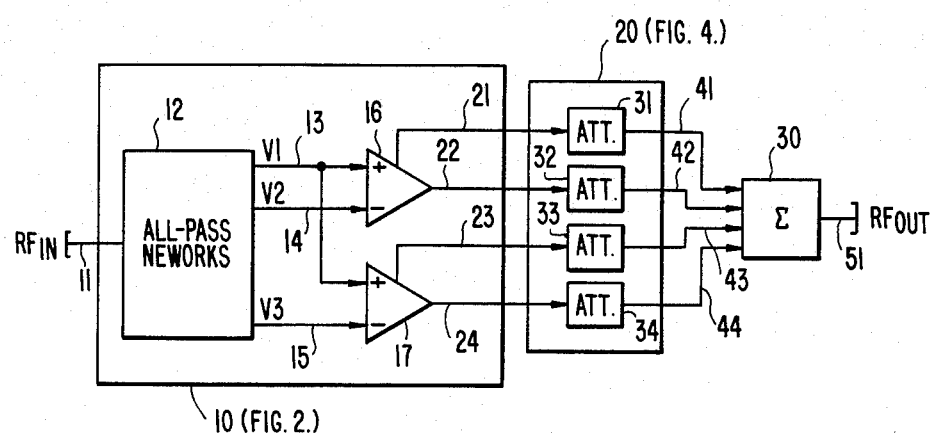
FIG. 1 is a schematic block diagram of a complex weighting circuit in accordance with the present invention.

Referring now to FIG. 1, a schematic block diagram of the complex weight circuit in accordance with the present invention is shown as comprising an orthogonal phase generator stage 10 coupled to input line 11 to receive an (RF) input signal to be subjected to the controlled phase-shifting and attenuation operation of the complex weight over line 11. Orthogonal phase generator stage 10 contains two parallel all-pass networks 12 which produce respective output voltages V1, V2 and V3 on output links 13, 14 and 15. These links are coupled to a pair of differential amplifiers 16 and 17, the outputs of which are supplied in respective complementary pairs over links 21, 22 and 23, 24, to provide four mutually orthogonal vectors respectively shifted in phase relative to the input signal on line 11 and have relative values 0°, 90°, 180°, −90°, as shown in the vector diagram FIG. 3. Links 21–24 are coupled to respective attenuator circuits 31–34 of an attenuator stage 20. Each of the attenuator circuits 31–34 may comprise a pair of cascaded dual-gate field effect transistor attenuators, shown schematically in FIG. 4 and described in copending U.S. patent application Ser. No. 818,082 filed on Jan. 13, 1986, entitled "Phase-Compensated FET Attenuator" by S. T. Salvage et al, now U.S. Pat. No. 4,700,153, issued Oct. 13, 1987 assigned to the Assignee of the present application. Each of attenuator stages 31–34 controllably attenuates the magnitude of the vector input supplied to it and produces a modified or attenuated representation of a respective one of the four orthogonal vectors shown in FIG. 3 over output links 41–44. Output links 41–44 are summed together in adder 30 to produce an output signal over link 51, corresponding to the input supplied on link 11, but subjected to a controlled phase shift of a value from 0°–360° and gain/attenuation from +10 dB to −30 dB. The manner in which this controlled phase shift is achieved will be better understood from the detailed description of the components of the complex weight circuit of FIG. 1, to be described below in conjunction with the description of FIGS. 2–5.

Figure 2:
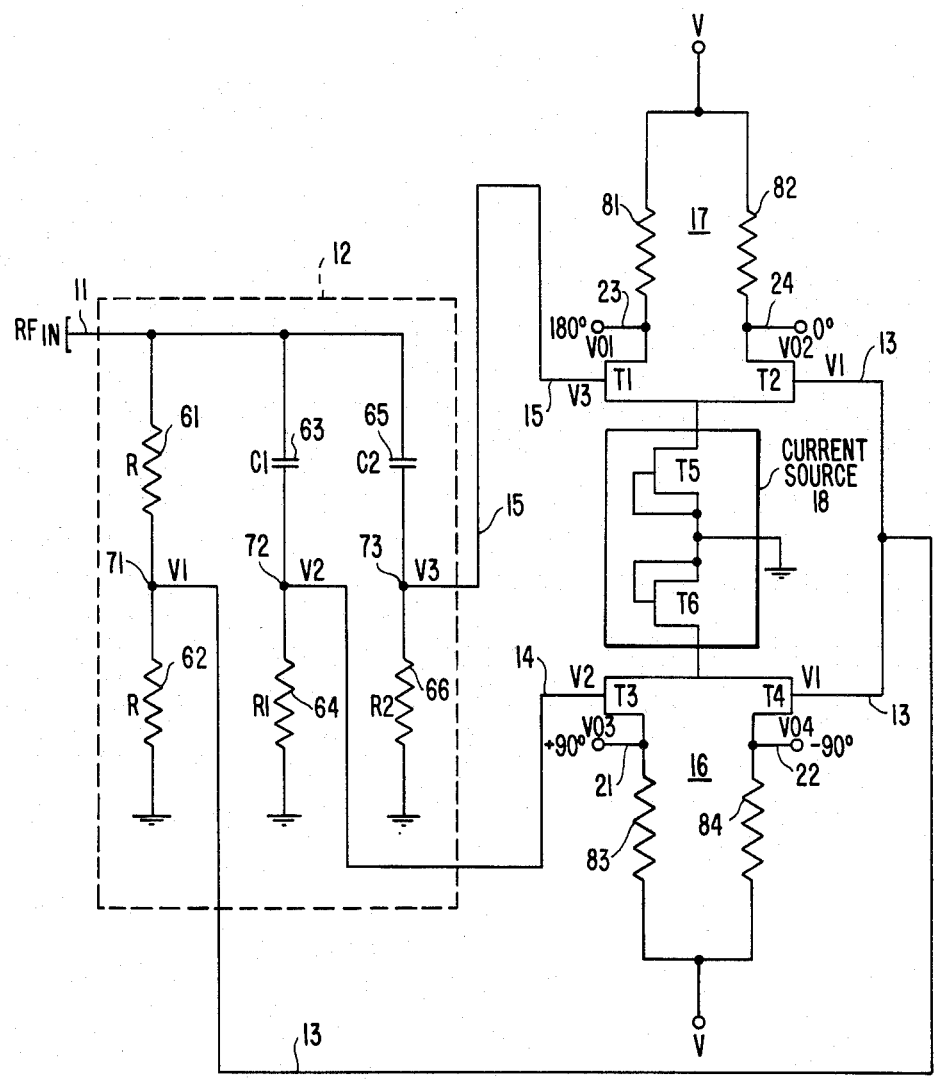
FIG. 2 is a detailed schematic diagram of the orthogonal phase vector generator stage 10 of FIG. 1.

More particularly, the orthogonal phase generator stage, shown in detail in FIG. 2, is comprised of a pair of parallel all-pass networks 12 which feed a pair of differential amplifiers 16 and 17. Parallel all-pass networks 12 contain a first resistive voltage divider network comprised of resistors 61 and 62 coupled between input link 11 and a reference potential (ground). The node 71 between resistors 61 and 62 is coupled over link 13 to the respective gate inputs of field effect transistors T2 and T4 of the differential amplifier circuits 16 and 17. Coupled in parallel with the resistive voltage divider network are a pair of passive, phase shifting RC networks comprised of a series connection of capacitor 63 and resistor 64 between line 11 and ground, and a series connection of a capacitor 65 and resistor 66 between line 11 and ground. Node 72 between capacitor 63 and resistor 64 is coupled over link 14 to the gate input of field effect transistor T3 of differential amplifier 16. Node 73, between capacitor 65 and resistor 66, is coupled over link 15 to the gate input of field effect transistor T1 of differential amplifier 17. The first all-pass transfer function is formed by taking the difference voltage between nodes 72 and 71, and the second all-pass transfer function is realized by taking the difference voltage between nodes 73 and 71.

A current source 18, comprised of transistors T5 and T6, is coupled to the source electrodes of transistors T1–T4 of differential amplifiers 16 and 17, as shown, while the drains thereof are coupled through resistors 81–84, respectively, to a bias potential source V.

In operation parallel all-pass networks 12 split an input signal supplied over link 11 into two components of different phase and the same amplitude over an extremely wide bandwidth. The particular phase difference is selected by adjusting the values of the resistor capacitor components. For a description of the make-up and operation of an all-pass phase splitting network, attention may be directed to literature on the subject, including an article entitled "Normalized Design of 90° Phase-Difference Networks" by S. D. Bedrosian, IRE Transactions on Circuit Theory, June 1960, an article entitled "90-Degree Phase-Difference Networks Are Simply Designed with a Program in Basic" by A. G. Lloyd, Electronic Design 19, Sept. 13, 1976 and an article entitled "Design of RC Wide-Band 90-Degree Phase-Difference Network" by Donald K. Weaver, I.R.E. Proceedings, April 1954.

By the coupling output voltages V1, V2 and V3 on links 13, 14 and 15, respectively, of network 12, to a pair of differential amplifiers 16 and 17, there are obtained complementary outputs on links 21–24, respectively representative of the voltage differences (V1-V2 and V1-V3). With the values of the RC components of the all-pass network 12 selected to achieve a 90° phase split at the outputs (V1, V2, V3) thereof, differential amplifiers 16 and 17 produce on output links 21–24 respective equal amplitude phase vectors +90°, −90°, 180° and 0°, as diagrammatically illustrated in FIG. 3. Because the entire phase quadrature space is covered by the four vectors 21–24 produced at the output of differential amplifiers 16 and 17, it is possible to generate any phase within the quadrature phase plane by controlled attenuation of phase vectors 21–24 and combining the resultant attenuated vectors. Attenuation is preferably carried out using a pair of cascaded dual gate field effect transistors connected in the manner shown in FIG. 4 which, as noted previously, is a schematic illustration of a phase-compensated FET attenuator described in the above-identified copending application. Advantageously, this attenuator does not provide differential, attenuation-related phase shift itself, so that prescribed phase angle of the resultant vector can be accurately predicted, and thereby controlled, by simply controlling the degree of attenuation of each respective one of the orthogonal components supplied over links 21–24 to the attenuator stage.

Figure 4:
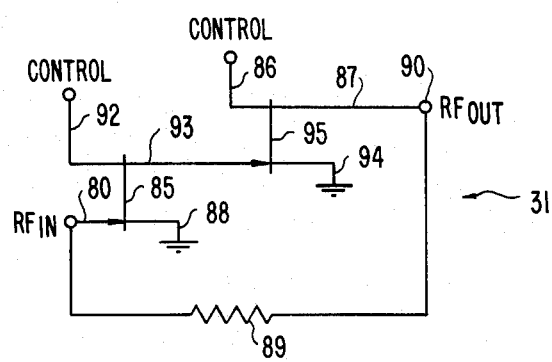
FIG. 4 is a schematic diagram of a dual gate attenuator circuit employed in the attenuator stage 20 of FIG. 1.

In the dual gate MESFET pair attenuator stage shown in FIG. 4, the input vector of interest is applied over line 80 to a first gate of a dual gate MESFET 85. A second gate of MESFET 85 is coupled over link 92 to a control electrode 92. The source electrode is coupled to reference potential (ground) via link 88 while the drain electrode of MESFET 85 is coupled over link 93 to one of the gates of a second MESFET 95. A control voltage for controlling the attenuation of MESFET 95 is coupled over link 86 to a second gate of the MESFET. Its source is coupled via link 94 to ground, while its drain is coupled via link 87, through a feedback resistor 89, to input link 80. By cascading the dual gate MESFETs in the manner shown in FIG. 4, there is provided a substantial range of amplitude attenuation between input terminal 80 and output terminal 90, but without any substantial phase shift vs. attenuation thereacross. Thus, by incorporating the dual gate MESFET attenuator circuit shown in FIG. 4 for each of the attenuator circuits 31–34 of the attenuator stage 20 of the complex weight shown in FIG. 1 makes it possible to selectively control the degree of attenuation of each of the vector outputs on links 21–24 from phase generator stage 10.

Figure 3:
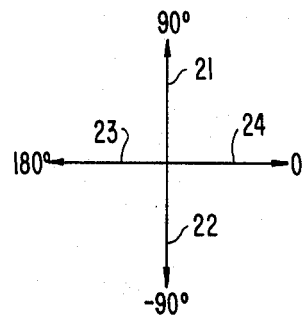
FIG. 3 is a vector diagram illustrating a set of four orthogonal vectors produced by the orthogonal phase generator stage shown in detail in FIG. 2.
Figure 5:
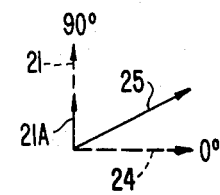
FIG. 5 is a vector diagram showing the operation of the attenuator stage 20 and combining stage 30 of FIG. 1.

FIG. 5 illustrates the manner of obtaining a desired phase angle by selectively attenuating and combining vectors in the first quadrant of FIG. 3. Specifically, the vector inputs on links 21 and 24 to respective attenuator stages 31 and 34 are of equal amplitude, as shown in FIG. 3 and shown in the dotted lines of FIG. 5. By the choice of the control voltage on links 92 and 86 in the attenuator stage of FIG. 4, vector 21 is attenuated to an amplitude 21A while vector 24 remains unchanged. Adder circuit 30 sums these two vectors to obtain a resultant vector 25.

It can be seen, therefore, that proper selection of control voltages applied to the dual gate MESFET attenuator stages 31–34 enables the complex weight circuit to produce any phase vector within the in-phase/quadrature phase plane encompassed by each of the four vectors 21–24 shown in FIG. 3, at output link 51.

Because the complex weight is based on parallel first order all-pass networks, it contains no inductive components and has considerably improved bandwidth characteristics relative to conventional 3 dB hybrid couplers. Moreover, without the use of inductive components, circuit fabrication is readily achieved using present day semiconductor manufacturing methodologies, including the use of gallium arsenide substrates. As a result, a complex weighting device obtained in accordance with the present invention is of considerably reduced size and lower cost, in addition to its improved reliability, making it readily adaptable to substantially all present day signal processing applications, including adaptive signal processing systems.

While we have shown and described an embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed:

1. A signal coupling network comprising:
   first means for receiving an input signal and for producing at a plurality of outputs thereof a respective plurality of first output signals shifted in phase with respect to each other;
   second means, coupled to the plurality of outputs of said first means, for combining selected ones of said plurality of first output signals and producing therefrom a plurality of second output signals, shifted in phase with respect to each other, at respective outputs thereof, said second means comprising a multiple differential amplifier circuit producing at complementary outputs thereof respective ones of said plurality of second output signals; and
   a plurality of third means, coupled to the respective outputs of said second means, for controllably modifying respective ones of said second output signals; and fourth means coupled to said coupled to said third means, for combining said controllably modified second output signals to produce a third output signal having a prescribed phase relative to the phase of said input signal.

2. A signal coupling network according to claim 1, wherein each of the second output signals produced by said second means has effectively the same amplitude and is effectively phase-orthogonal with respect to another second output signal.

3. A signal coupling network according to claim 1, wherein said first means comprises parallel all-pass networks.

4. A signal coupling network according to claim 1, wherein said first means comprises a network of signal coupling elements exclusive of inductor elements.

5. A signal coupling network according to claim 1, wherein each of said third means comprises a respective attenuator coupled to controllably attenuate a respective one of said second output signals without effectively altering the respective phase thereof.

6. A signal coupling network according to claim 7, wherein said fourth means further comprises means for effecting a vector summation of each of said controllably modified second output signals to derive said third output signal.

7. A signal coupling network according to claim 5, wherein each of said attenuators includes a dual gate field effect transistor attenuator circuit.

8. A signal coupling network according to claim 7, wherein each of said dual gate field effect transistor attenuator circuits comprises a plurality of cascaded field effect transistors having a feedback path between a drain output of one of the cascaded transistors and a gate input of another of the cascaded transistors.

9. A signal coupling network according to claim 8, wherein said feedback path includes a resistor element.

10. A signal coupling network according to claim 1, wherein said second means includes means for generating a plurality of second output signals the respective phases of which are offset relative to each other such that when selectively attenuated and combined with each other the resulting third output signal is capable of having an effective phase relative to said input signal of any value between 0° and 360°.

11. A signal coupling network according to claim 10, wherein each of the second output signals produced by said second means has effectively the same amplitude and is effectively phase-orthogonal with respect to another second output signal.

12. A signal coupling network according to claim 11, wherein said second means comprises means for producing four second output signals the phases of which are offset with respect to each other so that said four second output signals may be effectively represented by four equal amplitude phase vectors having respective relative phase values of 0°, 90°, −90° and ±180°.

13. A signal coupling network according to claim 10, wherein said first means comprises an all-pass network.

14. A signal coupling network according to claim 13, wherein said first means comprises a network of signal coupling elements exclusive of inductor elements.

15. A signal coupling network according to claim 14, wherein said second means comprises means for producing four second output signals the phases of which are offset with respect to each other so that said four second output signals may be effectively represented by four equal amplitude phase vectors having respective relative phase values of 0°, 90°, −90° and ±180°.

16. A signal coupling network according to claim 10, wherein each of said third means comprises a respective attenuator each of which is coupled to controllably attenuate a respective one of said second output signals without effectively altering the respective phase thereof.

* * * * *